(12) United States Patent
Wang et al.

(10) Patent No.: US 11,650,253 B2
(45) Date of Patent: May 16, 2023

(54) STATE ESTIMATION METHOD FOR POWER BATTERY FORMATION PROCESS BASED ON CONVEX SPACE FILTERING

(71) Applicant: Jiangnan University, Wuxi (CN)

(72) Inventors: Ziyun Wang, Wuxi (CN); Yan Wang, Wuxi (CN); Nanjiang Li, Wuxi (CN); Zhicheng Ji, Wuxi (CN); Yacong Zhan, Wuxi (CN); Yuqian Chen, Wuxi (CN); Zimeng Zhang, Wuxi (CN); Lin Cheng, Wuxi (CN); Weijie Shi, Wuxi (CN); Yinquan Yu, Wuxi (CN); Leiting Huo, Wuxi (CN)

(73) Assignee: Jiangnan University, Wuxi (CN)

( * ) Notice: Subject to any disclaimer, the term of this patent is extended or adjusted under 35 U.S.C. 154(b) by 0 days.

(21) Appl. No.: 17/892,217

(22) Filed: Aug. 22, 2022

(65) Prior Publication Data
US 2022/0413052 A1 Dec. 29, 2022

Related U.S. Application Data

(63) Continuation of application No. PCT/CN2021/130844, filed on Nov. 16, 2021.

(30) Foreign Application Priority Data

Jul. 30, 2021 (CN) .......................... 202110878186.0
Oct. 15, 2021 (CN) .......................... 202111206981.1

(51) Int. Cl.
*G01R 31/367* (2019.01)
*H02M 3/156* (2006.01)

(52) U.S. Cl.
CPC .......... *G01R 31/367* (2019.01); *H02M 3/156* (2013.01)

(58) Field of Classification Search
CPC ............................. H02M 3/156; G01R 31/367
See application file for complete search history.

(56) References Cited

U.S. PATENT DOCUMENTS

| 2010/0185405 | A1* | 7/2010 | Aoshima | ................ | B60L 58/22 |
| | | | | | 702/63 |
| 2017/0271984 | A1* | 9/2017 | Kohn | .................... | H02J 7/0068 |
| 2017/0338668 | A1* | 11/2017 | Sada | ........................ | H02J 3/32 |

FOREIGN PATENT DOCUMENTS

| CN | 102680898 A | 9/2012 |
| CN | 105629175 A | 6/2016 |

(Continued)

*Primary Examiner* — Ricky Go
(74) *Attorney, Agent, or Firm* — IPRO, PLLC (57) ABSTRACT

Disclosed is a state estimation method for a power battery formation process based on convex space filtering, belonging to the technical field of power battery manufacturing. The method performs state estimation on a time delay system by a filtering method, and an iterative replacement method is provided for converting the state quantity at a time k to the state quantity at a time k−h and subsequent items, so as to combine time delay items, thereby avoiding the problem that the dimension is increased when a state matrix A and a state matrix $A_h$ of a time-delay state quantity are subsequently combined into a new state matrix, and reducing the computation complexity and computation time in subsequent computations. Moreover, the estimation accuracy is also improved to a certain extent because of the cancellation of the same items in the iterative replacement. In addition, the method of this application uses two times of update when obtaining an update step, so that the obtained convex space is wrapped more compactly, so as to improve the state estimation accuracy for the battery formation process.

12 Claims, 4 Drawing Sheets

(56) References Cited

FOREIGN PATENT DOCUMENTS

| | | | |
|---|---|---|---|
| CN | 106154075 | A | 11/2016 |
| CN | 108614221 | A | 10/2018 |
| CN | 109932598 | A | 6/2019 |
| CN | 110855149 | A | 2/2020 |
| CN | 112217226 | A | 1/2021 |
| CN | 113589179 | A | 11/2021 |

* cited by examiner

STATE ESTIMATION METHOD FOR POWER BATTERY FORMATION PROCESS BASED ON CONVEX SPACE FILTERING

TECHNICAL FIELD

The disclosure relates to a state estimation method for a power battery formation process based on convex space filtering, and belongs to the technical field of power battery manufacturing.

BACKGROUND

In recent years, batteries have been widely used in energy storage power stations, energy storage power supplies, electric tools, electric bicycles, hybrid electric vehicles, pure electric vehicles, and the like and have become one of the important ways to deal with the global energy crisis and the environmental protection pressure.

The production processes of batteries are complex, and the formation is one of the key processes in battery production and has a crucial influence on battery properties. The formation of batteries is also a first charging process of batteries after liquid injection and aging, and is a process of activating active substances of cells. The essence is a process of forming an SEI film (that is, when charging for the first time, Li+ is deintercalated from active materials of a positive electrode for the first time and reaches the graphite of a negative electrode for the first time, so as to form a passivation thin layer covering a surface of the negative electrode on a phase interface between the negative electrode and an electrolyte, namely the SEI film).

However, the forming process of the SEI film is very complex, and are affected by many factors. The formation process directly affects the film forming quality of the SEI film and determines the electrical properties of cells. Furthermore, because of the inevitable time delay phenomenon in the formation process and few existing research methods for time delay systems, in order to obtain state true values such as charging and discharging currents for the best properties more accurately, state estimation is required for systems with time delays, and to improve the production efficiency of enterprises and the product quality, an accurate and efficient method for state estimation of time delay systems is explored.

Existing methods for state estimation of a time delay system usually perform state dimension expansion first to transform the system into an augmented system without a time delay, and then performs state estimation based on the augmented system without a time delay. However, this method has a higher computation complexity and a larger estimated result conservation.

SUMMARY

In order to further improve the accuracy of state estimation of a DC/DC converter with a time delay in a power battery formation process, so as to improve the factory quality of power batteries and the service life of power batteries, reduce the computation quantity in an estimation process and improve the efficiency of state estimation, the disclosure provides a state estimation method for a power battery formation process based on convex space filtering. The method includes: during battery formation charging and discharging state estimation, respectively obtaining a prediction step and an update step at a time k+1 so as to combine the prediction step and the update step at the time k+1 into linear inequalities, and solving the linear inequalities to obtain upper and lower bounds containing a real state of a system at the time k+1.

In the method, when the update step at the time k+1 is obtained, first, the first-round measurement update representation of the state at the time k+1 is obtained according to an initial state quantity of a battery system and a system observation matrix, then, the second-round measurement update representation of the state at the time k+1 is obtained according to the first-round measurement update representation of the state at the time k+1 and the prediction step at the time k+1, the second-round measurement update representation of the state at the time k+1 is sorted into linear inequalities, and the linear inequalities corresponding to the second-round measurement update representation of the state at the time k+1 are solved to obtain the upper and lower bounds containing a real state of a system at the time k+1. The battery system refers to a time-delay DC/DC converter circuit system in a battery formation process.

Optionally, the method includes:

step 1: obtaining a model of the time-delay DC/DC converter circuit system in the battery formation process;

step 2: establishing a state space model of discretization of the time-delay DC/DC converter circuit system according to the model of the time-delay DC/DC converter circuit system obtained in step 1;

step 3: obtaining an initial state space parameter matrix, an initial state quantity, an estimated step size and a time-delay step size h of the time-delay DC/DC converter circuit system;

step 4: obtaining a convex space representation of a feasible set of predicted states at the time k+1 according to the state space model established in step 2 by virtue of the initial state space parameter matrix, the initial state quantity and the time-delay step size h obtained in step 3;

step 5: on the basis of obtaining the convex space representation of the feasible set of the predicted states at the time k+1 in step 4, obtaining a convex space representation of second-round update of the state at the time k+1;

step 6: sorting the convex space representation of second-round update of the state at the time k+1 into linear inequalities according to convex space constraints; and step 7: solving the linear inequalities obtained in step 6 by linear programming to obtain the upper and lower bounds containing the real state of the system at the time k+1.

Optionally, step 5 includes:

5.1: obtaining the first-round measurement update representation $S_{k+1}$ of the state at the time k+1 according to original output data of the battery system and the system observation matrix; and 5.2: taking an intersection of the first-round measurement update representation $S_{k+1}$ of the state at the time k+1 and the convex space representation of the feasible set of the predicted states at the time k+1 obtained in step 4 to obtain the second-round measurement update representation $X(k+1)$ of the state at the time k+1.

Optionally, the time-delay DC/DC converter circuit system includes a DC power supply, an inductor, a capacitor and switch transistors $Q_1$ and $Q_2$; step 2 includes:

obtaining the following state expression according to the model of discretization of the time-delay DC/DC converter circuit system:

$$x(k+1) = \begin{cases} Ax(k) + Bu(k) + Dw(k), & 0 < k < h \\ Ax(k) + A_h x(k-h) + Bu(k) + Dw(k), & h \le k \end{cases} \quad (1)$$

Wherein the system state quantity is $x(k)=[i_{cha}(k)\ i_{dis}(k)\ v_c(k)]^T$, wherein $i_{cha}(k)$ and $i_{dis}(k)$ respectively represent currents flowing through the inductor during charging and discharging of the time-delay DC/DC converter circuit system, and $v_c(k)$ represents an output voltage of the time-delay DC/DC converter circuit system;

the system input quantity is $u(k)=[d_1(k)\ d_2(k)\ 0]^T$, wherein $d_1(k)$ and $d_2(k)$ respectively represent duty ratios of switching signals of the switch transistors $Q_1$ and $Q_2$; $w(k)$ represents an unknown but bounded perturbation noise, $|w(k)|_\infty \leq \overline{w}$, wherein $\overline{w}$ represents a maximum boundary value of the perturbation noise;

A represents a state space matrix of the time-delay DC/DC converter circuit system, $A_h$ represents a state space matrix of a time-delay state quantity, h represents a time-delay step size, B represents an input matrix, and D represents a perturbation action matrix;

taking an inductor current measured value $\tilde{i}_{cha}(k)$ during charging, an inductor current measured value $\tilde{i}_{dis}(k)$ during discharging, and an output voltage measured value $\tilde{v}_c$ of the system as the output of the state space model, and furthermore, adding a measurement noise $v(k)$ to obtain an output equation:

$$y(k)=Cx(k)+v(k) \tag{3}$$

wherein the system output quantity is $y(k)=[\tilde{i}_{cha}(k)\ \tilde{i}_{dis}(k)\ \tilde{v}_c]^T$, wherein $\tilde{i}_{cha}(k)$ and $\tilde{i}_{dis}(k)$ respectively represent inductor current measured values in charging and discharging modes, and $\tilde{v}_c$ represents an output voltage measured value of the system; and establishing a state space model of the time-delay DC/DC converter circuit system according to Expression (1) and Expression (3):

$$x(k+1) = \begin{cases} Ax(k) + Bu(k) + Dw(k), & 0 < k < h \\ Ax(k) + A_h x(k-h) + Bu(k) + Dw(k), & h \leq k \end{cases} \tag{4}$$

$$y(k) = Cx(k) + v(k).$$

wherein $v(k)$ represents an unknown but bounded measurement noise, $|v(k)|_\infty \leq \overline{v}$, $\overline{v}$ represents a maximum boundary value of the measurement noise, and C represents an output matrix.

Optionally, step 4 includes:
obtaining the convex space representation of the feasible set of the predicted states at the time k+1 according to the state space model established in step 2 by virtue of the initial state space parameter matrix and the initial state quantity obtained in step 3:

$$\overline{X}(k+1)=\{\overline{x}:\overline{x}=A\overline{x}(k)+A_h\overline{x}(k-h)+Bu(k)+Dw(k),\overline{x}(k)\in \overline{X}(k),|w|_\infty \leq \overline{w}\} \tag{7}$$

wherein $\overline{X}(k)$ represents a state prediction feasible set at a time k, $k \geq h$, $|w|_\infty \leq \overline{w}$;

deriving system state prediction expressions at times k+1, k to k−h by virtue of the formula at a time $k \geq h$ in Expression (1), wherein Expression (9) and Expression (10) respectively represent expressions of $\overline{x}(k)$ and $(k-h)$:

$$\overline{x}(k+1)=A\overline{x}(k)+A_h\overline{x}(k-h)+Bu(k)+Dw(k) \tag{8}$$

$$\overline{x}(k)=A\overline{x}(k-1)+A_h\overline{x}(k-h-1)+Bu(k-1)+Dw(k-1) \tag{9}$$

$$\overline{x}(k-h)=A\overline{x}(k-h-1)+A_h\overline{x}(k-h-1)+Bu(k-h-1)+Dw(k-h-1) \tag{10}$$

substituting Expression (9) and Expression (10) into Expression (8) to obtain:

$$\begin{aligned}\overline{x}(k+1) &= A[A\overline{x}(k-1) + A_h\overline{x}(k-h-1) + Bu(k-1) + Dw(k-1)] + \\ &\quad A_h\overline{x}(k-h) + Bu(k) + Dw(k) \\ &= A^2\overline{x}(k-1) + AA_h\overline{x}(k-h-1) + ABu(k-1) + ADw(k-1) + \\ &\quad A_h\overline{x}(k-h) + Bu(k) + Dw(k) \\ &= A^2[A\overline{x}(k-2) + A_h\overline{x}(k-h-2) + Bu(k-2) + \\ &\quad Dw(k-2)] + AA_h\overline{x}(k-h-1) + ABu(k-1) + \\ &\quad ADw(k-1) + A_h\overline{x}(k-h) + Bu(k) + Dw(k) \\ &= (A_h + A^{h+1})\overline{x}(k-h) + \sum_{i=1}^{h} A^i A_h \overline{x}(k-h-i) + \\ &\quad \sum_{i=0}^{h} A^i (Bu(k-i) + Dw(k-i))\end{aligned} \tag{11}$$

defining the following expressions:

$$E=A_h+A^{h+1} \tag{12}$$

$$F_i=A^i A_h, 1 \leq i \leq h \tag{13}$$

$$G_j=A^j B, 0 \leq j \leq h \tag{14}$$

$$H_l=A^l D, 0 \leq l \leq h \tag{15}$$

substituting Expressions (12) to (15) into Expression (11) to obtain:

$$\overline{x}(k+1) = E\overline{x}(k-h) + \sum_{i=1}^{h} F_i \overline{x}(k-h-i) + \sum_{j=0}^{h} G_j u(k-j) + \sum_{l=0}^{h} H_l w(k-l); \tag{16}$$

and
expressing a feasible set of predicted states of the system as the following convex space:

$$\overline{x}(k+1) \in \overline{X}(k+1) \subseteq \text{Set}(\overline{M}_{k+1}, \overline{\alpha}_{k+1}) = \{\overline{M}_{k+1}\overline{x}(k+1) \leq \overline{\alpha}_{k+1}\} \tag{17}$$

wherein $$\overline{M}_{k+1} = \overline{M}_{k-h} E^{-1},$$

$$\overline{\alpha}_{k+1} = \overline{\alpha}_{k-h} + \sum_{i=1}^{h-1} A_i^{-1} \overline{\alpha}_{k-h-i} + A_h^{-1} \overline{\alpha}_{k-2h} + \overline{M}_{k+1} E^{-1}\left[\sum_{j=0}^{h} G_j u(k-j) + \sum_{l=0}^{h} H_l \overline{w}(k-l)\right],$$

$$E = A_h + A^{h+1},$$

$$F_i = A^i A_h,$$

$$G_j = A^j B,$$

$$H_l = A^l D.$$

Optionally, the obtaining the first-round measurement update representation $S_{k+1}$ of the state at the time k+1 according to original output data of the battery system and the system observation matrix in step 5.1 includes:

obtaining the first-round measurement update representation $S_{k+1}$ of the state at the time k+1 according to the following Expression (18):

$$S_{k+1}=\{\overline{x}(k+1):y(k+1)=C\overline{x}(k+1)+v(k+1),|v(k+1)|_\infty \leq \overline{v}\} \tag{18}$$

wherein $|v(k+1)|_\infty \leq \overline{v}$ represents an observation noise and interference, indicating that the noise interference meets bounded constraints; and the first-round measurement update representation $S_{k+1}$ of the state at the time k+1 is spatially represented as a strip space.

Optionally, the taking an intersection of the first-round measurement update representation $S_{k+1}$ of the state at the time k+1 and the convex space representation of the feasible set of the predicted states at the time k+1 obtained in step 4 to obtain the second-round measurement update representation X(k+1) of the state at the time k+1 in 5.2 includes:

obtaining the second-round measurement update representation X(k+1) of the state at the time k+1 according to the following Expression (19):

$$X(k+1) = S_{k+1} \cap \bar{X}(k+1) \\ = S_{k+1} \cap Set(\bar{M}_{k+1}, \bar{\alpha}_{k+1}) \\ = Set(M_{k+1}, \alpha_{k+1}) \\ = M_{k+1}x(k+1) \le \alpha_{k+1}$$  (19)

wherein $\bar{X}(k+1)$ represents a prediction set at the time k+1, $S_{k+1}$ represents a strip space at the time k+1, $Set(M_{k+1}, \alpha_{k+1})$ represents a convex space representation of a real state set, and $M_{k+1}$ and $\alpha_{k+1}$ represent convex space constraints met by the real state at the time k+1.

Optionally, step 6 includes:

the convex space constraints being as follows:

$$x(k) \in X(k) \subseteq Set(M_k, \alpha_k) = \{x(k) : M_k x(k) \le \alpha_k\}$$  (21), wherein X(k) represents a feasible set of states containing a real state x(k) of the system at the time k, and $Set(M_k, \alpha_k)$ represents a convex space composed of feasible set elements x(k);

deriving convex space representations of first-round update according to Expression (18):

$$|y(k+1) - Cx(k+1)| \le \bar{v}(k+1)$$  (22), $$Cx(k+1) \le \bar{v}(k+1) + y(k+1)$$  (23), $$-Cx(k+1) \le \bar{v}(k+1) - y(k+1)$$  (24);

sorting the convex space representations into a matrix:

$$\tilde{M}_{k+1} x(k+1) \le \tilde{\alpha}_{k+1}$$  (25);

finally, combining the convex space in the prediction step and the update step, and performing sorting and second-round update to obtain:

$$\bar{M}_{k+1} x(k+1) \le \bar{\alpha}_{k+1},$$  (26)

$$\tilde{M}_{k+1} x(k+1) \le \tilde{\alpha}_{k+1}$$  (27)

wherein $$\bar{M}_{k+1} = \bar{M}_{k+1} E^{-1},$$

$$\tilde{M}_{k+1} = [C \; -C]^T$$

$$\bar{\alpha}_{k+1} = \bar{\alpha}_{k-h} + \sum_{i=1}^{h-1} A_i^{-1} \bar{\alpha}_{k-h-i} + $$

$$A_h^{-1} \bar{\alpha}_{k-2h} + \bar{M}_{k+1} E^{-1} \left[ \sum_{j=0}^{h} G_j u(k-j) + \sum_{l=0}^{h} H_l \bar{\omega}(k-l) \right]$$

$$\tilde{\alpha}_{k+1} = [\bar{v}(k+1) + y(k+1) \; \bar{v}(k+1) - y(k+1)]^T;$$

and sorting Expressions (26) and (27) to obtain:

$$M_{k+1} x(k+1) \le \alpha_{k+1}$$  (28), wherein $$M_{k+1} = \begin{bmatrix} \bar{M}_{k+1} \\ \tilde{M}_{k+1} \end{bmatrix}, \alpha_{k+1} = \begin{bmatrix} \bar{\alpha}_{k+1} \\ \tilde{\alpha}_{k+1} \end{bmatrix}.$$  (29)

Optionally, step 7 includes:

obtaining constraints of x(k+1) according to Expression (28);

setting an objective function as:

$$f_1 = [1\,0\,0\,0\,0\,0\,0\,0\,0]$$  (30)

$$f_2 = [0\,1\,0\,0\,0\,0\,0\,0\,0]$$

$$f_3 = [0\,0\,1\,0\,0\,0\,0\,0\,0];$$

solving the linear inequalities shown in Expression (28) by a linear programming function in an optimization toolbox of MATLAB software, and continuously iterating the linear inequalities shown in Expression (28) to obtain a convex space that wraps a true value of a system state at each moment at the time k+1 and upper and lower bounds thereof; and performing integration to obtain a state estimation value of the state space model at the time k+1, that is, a state estimation value of the time-delay DC/DC converter circuit system at the time k+1:

$$x(k+1)_f = \frac{x(k+1)_{max} + x(k+1)_{min}}{2},$$  (31)

wherein $x(k+1)_{max}$ represents an upper bound of the state estimation value, and $x(k+1)_{min}$ represents a lower bound of the state estimation value.

Optionally, a state space matrix A of the time-delay DC/DC converter circuit system is:

$$A = \begin{bmatrix} -\frac{V_{in}KP_2}{V_m L} & 0 & -\frac{1}{L} - \frac{V_{in}KP_2 KP_1}{V_m L} \\ 0 & -\frac{V_{in}KP_3}{V_m L} & -\frac{1}{L} \\ \frac{1}{C_1+C_2} & \frac{1}{C_1+C_2} & -\frac{1}{R(C_1+C_2)} \end{bmatrix};$$

and a state space matrix $A_h$ of the time-delay state quantity is:

$$A_h = \begin{bmatrix} 0 & -\frac{V_{in}KI_1 KP_2}{V_m L} & 0 \\ 0 & 0 & -\frac{V_{in}KI_2 KP_1}{V_m L} \\ -KP_1 & 0 & 0 \end{bmatrix},$$

wherein $V_{in}$ represents an input voltage, $V_m$ represents an output voltage, $KP_1$ and $KP_2$ represent parameters of PI controllers used by switch transistors $Q_1$ and $Q_2$, and L, $C_1$ and $C_2$ respectively represent an inductor and two capacitor parameters in a circuit.

Optionally, the input matrix is $$B = \begin{bmatrix} 0.2 \\ 0.3 \\ 0.8 \end{bmatrix}.$$

Optionally, the perturbation action matrix is $$D = \begin{bmatrix} 0.1 \\ 0.1 \\ 0.1 \end{bmatrix}.$$

Optionally, the output matrix is $$C = \begin{bmatrix} 1 & 0 & 0 \\ 0 & 1 & 0 \\ 0 & 0 & 1 \end{bmatrix}.$$

Optionally, the initial state quantity of the time-delay DC/DC converter circuit system is set as: $x_0=[0\ 0\ 0]^T$.

This application further provides a time-delay DC/DC converter circuit system for a battery formation process based on convex space filtering. The time-delay DC/DC converter circuit system for a battery formation process uses the above-mentioned battery pooling charging and discharging state estimation method based on convex space filtering to perform battery formation current and voltage state estimation.

Optionally, the time-delay DC/DC converter circuit system includes a DC power supply, an inductor, a capacitor and switch transistors $Q_1$ and $Q_2$.

Optionally, N-channel MOS transistors are used as the switch transistors $Q_1$ and $Q_2$.

The disclosure has the following beneficial effects:

In this application, by strengthening the tight combination of the prediction step and the update step, the convex space is wrapped more compactly. In this application, the first-round update equation obtained by the original data is further intersected with the prediction set representation to obtain the convex space representation of the second-round update equation, so that the convex space is wrapped more compactly, thereby reducing the algorithm conservation and further improving the state estimation accuracy for the battery formation process. Further, this application innovatively provides an iterative replacement method for converting the state quantity at the time k to the state quantity at the time k–h and subsequent items, so as to combine time delay items, thereby avoiding the problem that the dimension is increased when the state matrix A and the state matrix $A_h$ of the time-delay state quantity are subsequently combined into a new state matrix, and reducing the computation complexity and computation time in subsequent computations. Moreover, the estimation accuracy is also improved to a certain extent because of the cancellation of the same items in the iterative replacement.

BRIEF DESCRIPTION OF FIGURES

In order to illustrate the technical solutions in the embodiments of the disclosure more clearly, the accompanying drawings required for description of the embodiments will be briefly introduced below. Apparently, the accompanying drawings in the following description show merely some embodiments of the disclosure, and a person of ordinary skill in the art may still derive other accompanying drawings from these accompanying drawings without creative efforts.

DETAILED DESCRIPTION

In order to make the objectives, technical solutions and advantages of the disclosure clearer, the implementations of the disclosure will be further described in detail below with reference to the accompanying drawings.

Embodiment 1

Figure 1:
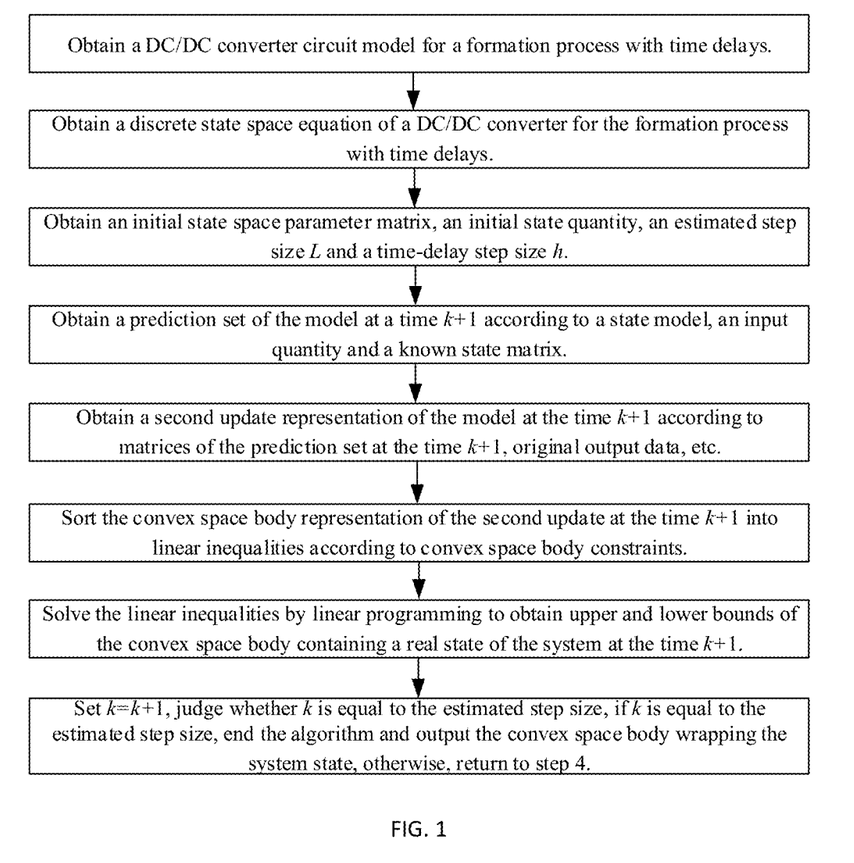
FIG. 1 is a flow diagram of a state estimation method for charging and discharging currents and voltages in a battery formation process based on convex space filtering disclosed in an embodiment of the disclosure.

This embodiment provides a state estimation method for a power battery formation process based on convex space filtering, referring to FIG. 1. The method includes the following steps:

step 1: a model of a time-delay DC/DC converter circuit system in a battery formation process is obtained;

step 2: a state space model of discretization of the time-delay DC/DC converter circuit system is established according to the model of the time-delay DC/DC converter circuit system obtained in step 1;

step 3: an initial state space parameter matrix, an initial state quantity, an estimated step size and a time-delay step size h of the time-delay DC/DC converter circuit system are obtained;

step 4: a convex space representation of a feasible set of predicted states at the time k+1 is obtained according to the state space model established in step 2 by virtue of the initial state space parameter matrix, the initial state quantity and the time-delay step size h obtained in step 3;

step 5: on the basis of obtaining the convex space representation of the feasible set of the predicted states at the time k+1 in step 4, a convex space representation of second-round update of the state at the time k+1 is obtained;

step 6: the convex space representation of second-round update of the state at the time k+1 is sorted into linear inequalities according to convex space constraints; and step 7: the linear inequalities obtained in step 6 are solved by linear programming to obtain the upper and lower bounds containing the real state of the system at the time k+1.

Step 5 includes:

5.1: the first-round measurement update representation $S_{k+1}$ of the state at the time k+1 is obtained according to original output data of the battery system and the system observation matrix; and 5.2: an intersection of the first-round measurement update representation $S_{k+1}$ of the state at the time k+1 and the convex space representation of the feasible set of the predicted states at the time k+1 obtained in step 4 is taken to obtain the second-round measurement update representation X(k+1) of the state at the time k+1.

Embodiment 2

This embodiment provides a state estimation method for a power battery formation process based on convex space filtering. The method includes the following steps.

Step 1: a model of a time-delay DC/DC converter circuit system in a battery formation process is obtained.

Figure 2:
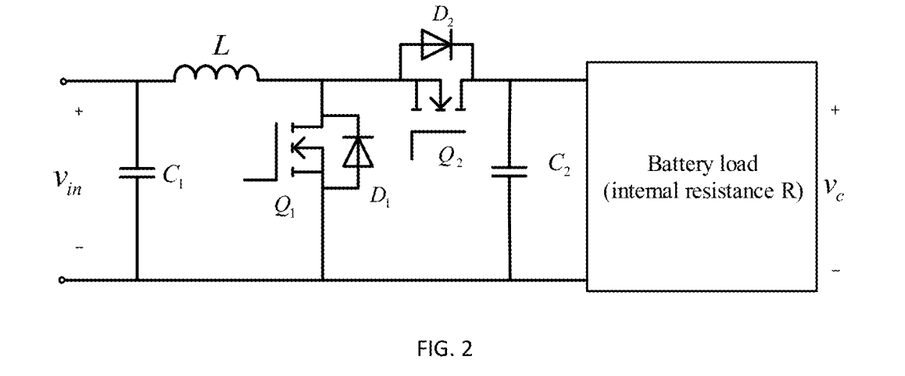
FIG. 2 is a model diagram of a time-delay DC/DC converter circuit system in a power battery formation process.

As shown in FIG. 2, the time-delay DC/DC converter circuit system in the power battery formation process includes a DC power supply, an inductor, a capacitor, and other components.

In FIG. 2, a DC terminal is the DC power supply. Usually, in a battery formation process, the amplitude of the DC power supply used is 10 V, L is a 330 µH inductor, capacitors $C_1=C_2=220$ pf, and $Q_1=Q_2$ are N-channel MOS transistors, wherein $D_1$ and $D_2$ are diodes inside the MOS transistors.

Figure 3:
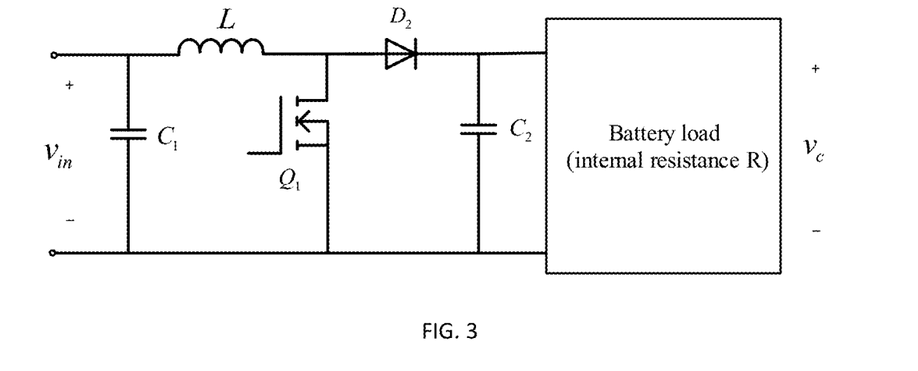
FIG. 3 is a circuit topology diagram of a time-delay DC/DC converter circuit system in a charging mode disclosed in an embodiment of the disclosure.

When the DC terminal is used as the input, the circuit works in a charging mode. A circuit topology is shown in FIG. 3, and a basic topology is a Buck circuit. By using the DC power supply at the DC terminal as the input, a PWM wave is used for controlling the switching of the $Q_1$ MOS transistor to achieve voltage reduction, so that batteries can be charged.

Figure 4:
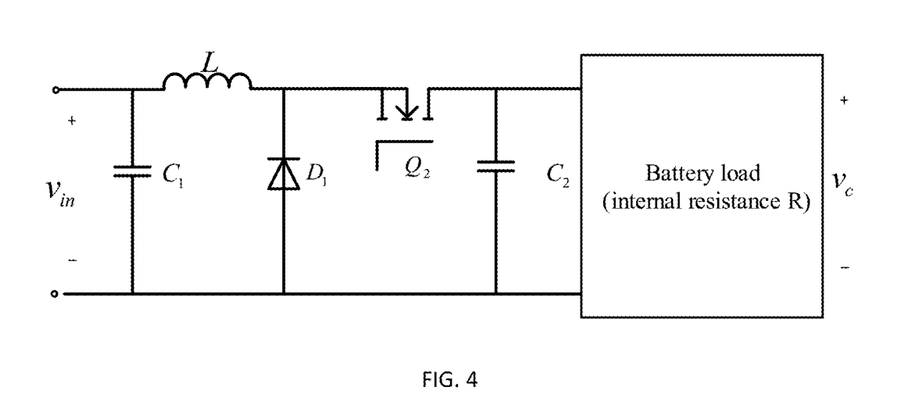
FIG. 4 is a circuit topology diagram of a time-delay DC/DC converter circuit system in a discharging mode disclosed in an embodiment of the disclosure.

When the DC terminal is used as the output, the circuit works in a discharging mode. A circuit topology is shown in FIG. 4, and a basic topology is a Boost circuit. By using a battery terminal as the input, the PWM wave is also used for controlling the switching of the $Q_2$ MOS transistor to achieve voltage boosting, so that batteries can be discharged.

Step 2: A state space model of the time-delay DC/DC converter circuit system is obtained according to the model of the time-delay DC/DC converter circuit system obtained in step 1.

The following state expression is obtained according to the model of the time-delay DC/DC converter circuit system:

$$x(k+1) = \begin{cases} Ax(k) + Bu(k) + Dw(k), & 0 < k < h \\ Ax(k) + A_h(k-h) + Bu(k) + Dw(k), & h \le k \end{cases} \quad (1)$$

wherein the system state quantity is $x(k)=[i_{cha}(k)\ i_{dis}(k)\ v_c(k)]^T$, wherein $i_{cha}(k)$ and $i_{dis}(k)$ respectively represent currents flowing through the inductor during charging and discharging of the time-delay DC/DC converter circuit system, and $v_c(k)$ represents an output voltage of the time-delay DC/DC converter circuit system;

the system input quantity is $u(k)=[d_1(k)\ d_2(k)\ 0]^T$, wherein $d_1(k)$ and $d_2(k)$ respectively represent duty ratios of switching signals of the switch transistors $Q_1$ and $Q_2$; w(k) represents an unknown but bounded perturbation noise, $|w(k)|_\infty \le \bar{w}$, wherein $\bar{w}$ represents a maximum boundary value of the perturbation noise;

$$A = \begin{bmatrix} -\frac{V_{in}KP_2}{V_mL} & 0 & -\frac{1}{L}-\frac{V_{in}KP_2KP_1}{V_mL} \\ 0 & -\frac{V_{in}KP_3}{V_mL} & -\frac{1}{L} \\ \frac{1}{C_1+C_2} & \frac{1}{C_1+C_2} & -\frac{1}{R(C_1+C_2)} \end{bmatrix} \quad (2)$$

$$A_h = \begin{bmatrix} 0 & -\frac{V_{in}KP_1KP_2}{V_mL} & 0 \\ 0 & 0 & -\frac{V_{in}KP_2KP_1}{V_mL} \\ KP_1 & 0 & 0 \end{bmatrix}$$

$$B = \begin{bmatrix} 0.2 \\ 0.3 \\ 0.8 \end{bmatrix} \quad D = \begin{bmatrix} 0.1 \\ 0.1 \\ 0.1 \end{bmatrix}.$$

A represents a state space matrix, wherein $V_{in}$ represents an input voltage, $V_m$ represents an output voltage, $KP_1$ and $KP_2$ represent parameters of PI controllers used by the MOS transistors, and the rest L, $C_1$ and $C_2$ represent parameters of corresponding components in the circuit. $A_h$ represents a state space matrix of a time-delay state quantity, h represents a time-delay step size, B represents an input matrix, and D represents a perturbation action matrix.

An inductor current measured value $\tilde{i}_{cha}(k)$ during charging, an inductor current measured value $\tilde{i}_{dis}(k)$ during discharging, and an output voltage measured value $\tilde{v}_c$ of the system are taken as the output of the state space model, and furthermore, a measurement noise v(k) is added to obtain an output equation:

$$y(k)=Cx(k)+v(k) \quad (3).$$

The system output quantity is $y(k)=[\tilde{i}_{cha}(k)\ \tilde{i}_{dis}(k)\ \tilde{v}_c]^T$, wherein $\tilde{i}_{cha}(k)$ and $\tilde{i}_{dis}(k)$ respectively represent inductor current measured values in charging and discharging modes, and $\tilde{v}_c$ represents an output voltage measured value of the system. v(k) represents an unknown but bounded measurement noise, that is, $|v(k)|_\infty \le \bar{v}$, wherein $\bar{v}$ represents a maximum boundary value of the measurement noise.

$$C = \begin{bmatrix} 1 & 0 & 0 \\ 0 & 1 & 0 \\ 0 & 0 & 1 \end{bmatrix}$$

represents an output matrix.

A state space model of the time-delay DC/DC converter circuit system is established according to Expression (1) and Expression (3):

$$x(k+1) = \begin{cases} Ax(k) + Bu(k) + Dw(k), & 0 < k < h \\ Ax(k) + A_h(k-h) + Bu(k) + Dw(k), & h \le k \end{cases} \quad (4)$$

$$y(k) = Cx(k) + v(k).$$

Step 3: An initial state space parameter matrix and an initial state quantity of the time-delay DC/DC converter circuit system are obtained, and an estimated step size and a time-delay step size h are set.

3.1: Parameters of each of the components in the time-delay DC/DC converter circuit system are obtained.

The parameters of each of the components in the time-delay DC/DC converter circuit system in this embodiment are shown in Table 1 below.

TABLE 1

Parameters of components in system converter

| Description | Parameter | Value |
|---|---|---|
| Input voltage | $V_{in}$ | 10 V |
| Output voltage | $V_o$ | 5 V |
| Capacitor 1 | $C_1$ | 220 μF |
| Capacitor 2 | $C_2$ | 220 μF |
| Inductor | L | 220 μH |
| Internal resistance of load | R | 3 Ω |
| Voltage loop proportional controller | $KP_1$ | 0.28 |
| Voltage loop integral controller | $KI_1$ | 264 |
| Current loop proportional controller | $KP_2$ | 0.106 |
| Voltage loop integral controller | $KI_2$ | 410 |
| Sawtooth wave amplitude | $V_m$ | 1 V |

3.2: An initial state space matrix of the time-delay DC/DC converter circuit system is obtained.

According to the parameters shown in Table 1, the initial state space matrix of the time-delay DC/DC converter circuit system is obtained as follows:

$$A = \begin{bmatrix} -0.0032 & 0 & -0.0039 \\ 0 & -0.0032 & -0.0030 \\ 0.0023 & 0.0023 & -0.0068 \end{bmatrix} \quad (5)$$

$$A_h = \begin{bmatrix} 0 & -0.8480 & 0 \\ 0 & 0 & -0.00089 \\ -0.28 & 0 & 0 \end{bmatrix} \quad (6)$$

3.3: The initial state quantity of the system converter is obtained.

In this embodiment, the initial state of the system is set as: $x_0 = [0\ 0\ 0]^T$, that is, the system is in a zero initial state.

3.4: An estimated step size and a time-delay step size h are set.

The estimated step size is set according to the duration of the system to be predicted. For example, to predict the state of the system within 500 seconds, the estimated step size can be set to 500. In a subsequent simulation experiment, the estimated step size is set to 250.

For the time-delay step size, according to the actual data of the system to be predicted, the time-delay step size h is calculated and derived by Expression (4). In Expression (4), both x(k) and y(k) are known, and the matrices A, $A_h$, B and D are known, so the time-delay step size h can be computed and derived.

Step 4: The convex space representation of the feasible set of the predicted states at the time k+1 is obtained according to the state space model established in step 2 by virtue of the initial state space parameter matrix and the initial state quantity obtained in step 3.

The prediction step at the time k+1 is obtained according to the initial state space parameter matrix and the initial state quantity by the following formula:

$$\overline{X}(k+1) = \{\overline{x}:\overline{x} = A\overline{x}(k) + A_h\overline{x}(k-h) + Bu(k) + Dw(k),$$
$$\overline{x}(k) \in X(k), |w|_\infty \leq \overline{w}\} \quad (7),$$

wherein A, $A_h$, B and D represent known matrices, $\overline{X}(k)$ represents a state prediction feasible set at the time k, k≥h, and $|w|_\infty \leq \overline{w}$.

System state prediction expressions at times $k+1$, k to k−h are derived by virtue of the formula at a time k≥h in Expression (1), wherein Expression (9) and Expression (10) respectively represent expressions of $\overline{x}(k)$ and $\overline{x}(k-h)$.

$$\overline{x}(k+1) = A\overline{x}(k) + A_h\overline{x}(k-h) + Bu(k) + Dw(k) \quad (8),$$

$$\overline{x}(k) = A\overline{x}(k-1) + A_h\overline{x}(k-h-1) + Bu(k-1) + Dw(k-1) \quad (9),$$

$$\overline{x}(k-h) = A\overline{x}(k-h-1) + A_h\overline{x}(k-h-1) + Bu(k-h-1) + Dw(k-h-1) \quad (10).$$

Expression (9) and Expression (10) are substituted into Expression (8) to obtain:

$$\overline{x}(k+1) = A[A\overline{x}(k-1) + A_h\overline{x}(k-h-1) + Bu(k-1) + Dw(k-1)] + \quad (11)$$
$$A_h\overline{x}(k-h) + Bu(k) + Dw(k)$$
$$= A^2\overline{x}(k-1) + AA_h\overline{x}(k-h-1) + ABu(k-1) + ADw(k-1) +$$
$$A_h\overline{x}(k-h) + Bu(k) + Dw(k)$$
$$= A^2[A\overline{x}(k-2) + A_h\overline{x}(k-h-2) + Bu(k-2) + Dw(k-2)] +$$
$$AA_h\overline{x}(k-h-1) + ABu(k-1) + ADw(k-1) + A_h\overline{x}(k-h) +$$
$$Bu(k) + Dw(k)$$
$$= (A_h + A^{h+1})\overline{x}(k-h) + \sum_{i=1}^{h} A^i A_h \overline{x}(k-h-i) +$$
$$\sum_{i=0}^{h} A^i(Bu(k-i) + Dw(k-i)).$$

The following expressions are defined:

$$E = A_h + A^{h+1} \quad (12),$$

$$F_i = A_i A_h, 1 \leq i \leq h \quad (13),$$

$$G_j = A^j B, 0 \leq j \leq h \quad (14),$$

$$H_l = A^l D, 0 \leq l \leq h \quad (15).$$

Expressions (12) to (15) are substituted into Expression (11) to obtain:

$$\overline{x}(k+1) = \quad (16)$$
$$E\overline{x}(k-h) + \sum_{i=1}^{h} F_i \overline{x}(k-h-i) + \sum_{j=0}^{h} G_j u(k-j) + \sum_{l=0}^{h} H_l w(k-i).$$

A feasible set of predicted states of the system can be expressed as the following convex space:

$$\overline{x}(k+1) \in \overline{X}(k+1) \subseteq \text{Set}(\overline{M}_{k+1}, \overline{\alpha}_{k+1}) = \{\overline{M}_{k+1}\overline{x}(k+1) \leq \overline{\alpha}_{k+1}\}, \quad (17)$$

wherein $\overline{M}_{k+1} = \overline{M}_{k-h}E^{-1}$, $$\overline{\alpha}_{k+1} = \overline{\alpha}_{k-h} + \sum_{i=1}^{h-1} A_i^{-1} \overline{\alpha}_{k-h-i} +$$
$$A_h^{-1}\overline{\alpha}_{k-2h} + \overline{M}_{k+1}E^{-1}\left[\sum_{j=0}^{h} G_j u(k-j) + \sum_{l=0}^{h} H_l \overline{\omega}(k-l)\right],$$

$$E = A_h + A^{h+1}, F_i = A^i A_h, G_j = A^j B, H_l = A^l D.$$

By transforming the original state expression (7) of the prediction step at the time k+1 into Expression (11), that is, transforming the original expression with time delays into the form of Expression (17) that can be described by convex space constraints, the combination with a subsequent update step can be realized, thereby avoiding the disadvantage that the dimension of the state matrix generally needs to be expanded for time-delay state transformation, and reducing the computation complexity and computation time in subsequent computations.

An iterative replacement method of this step is used for converting all state quantities to the time k–h and the previous time, which can reduce the computation complexity and computation time in subsequent computations, providing great help for state estimation of time delay systems.

Step 5: On the basis of obtaining the prediction of the system state at the time k+1 in step 4, a convex space representation of second-round update of the state at the time k+1 is obtained.

5.1: The first-round measurement update representation $S_{k+1}$ of the state at the time k+1 is obtained according to original output data of the battery system and the system observation matrix:

$$S_{k+1}=\{\tilde{x}(k+1):y(k+1)=C\tilde{x}(k+1)+v(k+1),|v(k+1)|_\infty \leq \bar{v}\} \quad (18),$$

wherein $|v(k+1)|_\infty \leq \bar{v}$ represents an observation noise and interference, indicating that the noise interference meets bounded constraints; and the first measurement update representation $S_{k+1}$ of the state at the time k+1 is spatially represented as a strip space.

5.2: An intersection of the first-round measurement update representation $S_{k+1}$ of the state at the time k+1 and the convex space representation of the feasible set of the predicted states at the time k+1 obtained in step 4 is taken to obtain the second-round measurement update representation X(k+1) of the state at the time k+1:

$$\begin{aligned} X(k+1) &= S_{k+1} \cap \overline{X}(k+1) \\ &= S_{k+1} \cap \text{Set}(\overline{M}_{k+1}, \overline{\alpha}_{k+1}) \\ &= \text{Set}(M_{k+1}, \alpha_{k+1}) \\ &= M_{k+1}x(k+1) \leq \alpha_{k+1} \end{aligned} \quad (19)$$

wherein $\overline{X}(k+1)$ S represents a prediction set at the time k+1, $S_{k+1}$ represents a strip space at the time k+1, and Set $(M_{k+1},\alpha_{k+1})$ represents a convex space representation of a real state set, that is, the second-round update of the state at the time k+1 is completed.

The second-round measurement update representation of the state at the time k+1 is expressed as X(k+1), which is a set containing all real states x(k+1) at the time k+1, so:

$$x(k+1) \in X(k+1)=x(k+1)|M_{k+1}x(k+1)\leq \alpha_{k+1} \quad (20).$$

In this application, based on the original output data and matrix, the first-round update set is intersected with the prediction set at the time k+1 obtained in step 4 to obtain a new and more compact convex space representation of the second-round update set, which further reduces the state estimation conservation and improves the convex space wrapping compactness, achieving the improvement of the state estimation accuracy.

Step 6: According to convex space constraints, the convex space representation of the real state at the time k+1 is sorted into linear inequalities.

The convex space constraints are as follows:

$$x(k) \in X(k) \subseteq \text{Set}(M_k,\alpha_k)=\{x(k):M_kx(k)\leq \alpha_k\} \quad (21),$$

wherein X(k) represents a feasible set of states containing a real state x(k) of the system at the time k, and Set($M_k,\alpha_k$) represents a convex space composed of feasible set elements x(k).

According to Expression (17), the convex space representation of the prediction step is already known. Later, according to Expression (18), the convex space representations of first-round update can be derived:

$$|y(k+1)-Cx(k+1)|\leq \bar{v}(k+1) \quad (22),$$

that is, $$Cx(k+1)\leq \bar{v}(k+1)+y(k+1)+y(k+1) \quad (23),$$

$$-Cx(k+1)\leq \bar{v})(k+1)-y(k+1) \quad (24).$$

The convex space representations are sorted into a matrix representation:

$$\tilde{M}_{k+1}x(k+1)\leq \tilde{\alpha}_{k+1} \quad (25).$$

Finally, the convex space bodies in the prediction step and the update step are combined, and sorting and second-round update are performed to obtain:

$$\overline{M}_{k+1}x(k+1) \leq \overline{\alpha}_{k+1}, \quad (26)$$

$$\tilde{M}_{k+1}x(k+1) \leq \tilde{\alpha}_{k+1}, \text{ wherein} \quad (27)$$

$$\overline{M}_{k+1} = \overline{M}_{k+1}E^{-1}, \tilde{M}_{k+1} = [C \quad -C]^T$$

$$\overline{\alpha}_{k+1} =$$

$$\overline{\alpha}_{k-h} + \sum_{i=1}^{h-1}A_i^{-1}\overline{\alpha}_{k-h-i} + A_h^{-1}\overline{\alpha}_{k-2h} + \overline{M}_{k+1}E^{-1}\left[\sum_{j=0}^{h}G_ju(k-j) + \sum_{l=0}^{h}H_l\varpi(k-l)\right]$$

$$\tilde{\alpha}_{k+1} = [\bar{v}(k+1)+y(k+1) \quad \bar{v}(k+1)-y(k+1)]^T.$$

Expressions (26) and (27) are sorted to obtain:

$$M_{k+1}x(k+1) \leq \alpha_{k+1}, \text{ wherein} \quad (28)$$

$$M_{k+1} = \begin{bmatrix} \overline{M}_{k+1} \\ \tilde{M}_{k+1} \end{bmatrix}, \alpha_{k+1} = \begin{bmatrix} \overline{\alpha}_{k+1} \\ \tilde{\alpha}_{k+1} \end{bmatrix}. \quad (29)$$

Step 7: The linear inequalities are solved by linear programming to obtain a model state estimation value at the time k+1.

The Expression (28) is solved by linear programming to obtain the state model estimation value at the time k+1.

Constraints of x(k+1) are obtained according to Expression (28).

In this embodiment, in order to facilitate the computation, an objective function is taken as:

$$\begin{aligned} f_1 &= [1 \ 0 \ 0 \ 0 \ 0 \ 0 \ 0 \ 0] \\ f_2 &= [0 \ 1 \ 0 \ 0 \ 0 \ 0 \ 0 \ 0] \\ f_3 &= [0 \ 0 \ 1 \ 0 \ 0 \ 0 \ 0 \ 0]. \end{aligned} \quad (30)$$

In this way, the optimal values of the inductor current and the output voltage in the state quantity can be easily obtained. In practical applications, the objective function can be set according to actual computation requirements.

The linear inequalities shown in Expression (28) are solved by a linear programming function in an optimization toolbox of MATLAB software, and the linear inequalities shown in Expression (28) are continuously iterated to obtain a convex space that wraps a true value of a system state at each moment at the time k+1 and upper and lower bounds thereof.

Integration is performed to obtain a state estimation value of the state space model at the time k+1, that is, a state estimation value of the time-delay DC/DC converter circuit system at the time k+1:

$$x(k+1)_f = \frac{x(k+1)_{max} + x(k+1)_{min}}{2}, \quad (31)$$

wherein $x(k+1)_{max}$ represents an upper bound of the state estimation value, and $x(k+1)_{min}$ represents a lower bound of the state estimation value.

In order to evaluate the estimation performance of the method of this application, in this embodiment, by comparing the estimated results of the method of this application with two existing methods, the advantages and disadvantages of this method are judged. The two existing methods are respectively a method for state estimation by ellipsoid filtering (hereinafter referred to as an OBE method) and a method in the previous application with an application number 202110878186.0 applied by the inventor (hereinafter referred to as a CSCF method). The OBE method can be found in "ZHAO J M. A new result on reachable set estimation for time-varying delay singular systems. International Journal of Robust and Nonlinear Control, 2020, 31(3): 806-816."

Figure 5:
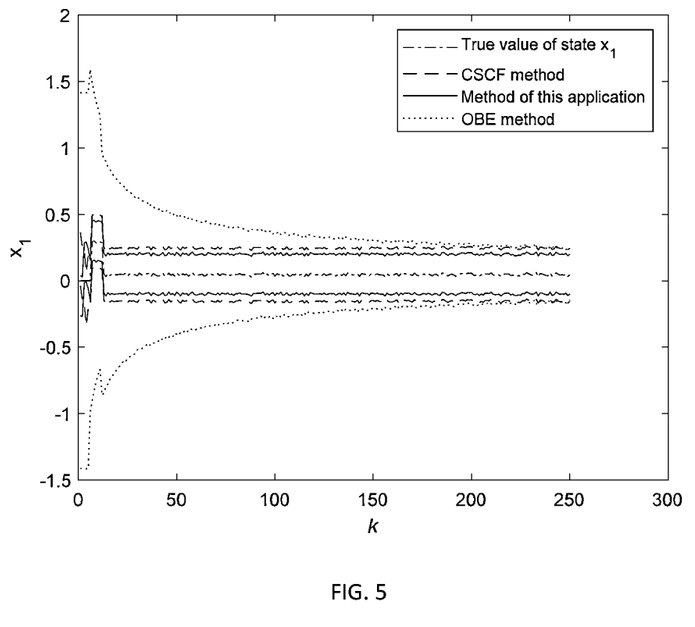
FIG. 5 is a state estimation relationship diagram of a state quantity $x_1$ of a time-delay DC/DC converter circuit system using the method of this application and other two methods disclosed in an embodiment of the disclosure.
Figure 6:
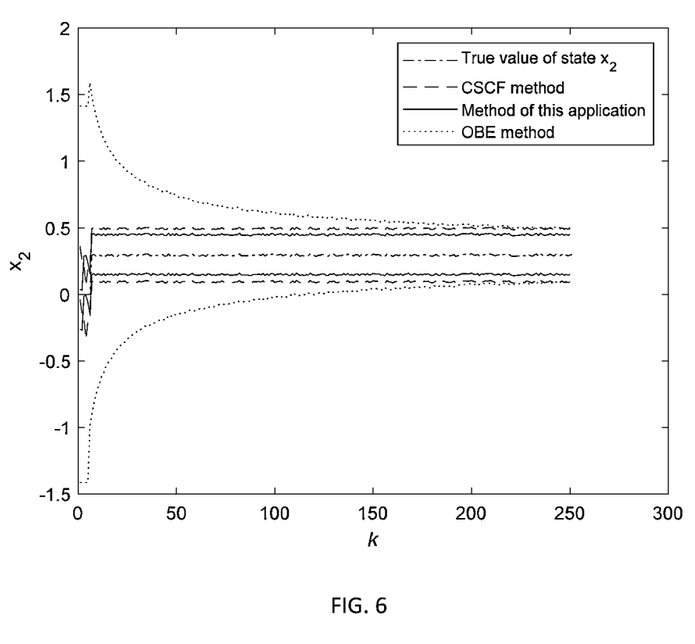
FIG. 6 is a state estimation relationship diagram of a state quantity $x_2$ of a time-delay DC/DC converter circuit system using the method of this application and other two methods disclosed in an embodiment of the disclosure.
Figure 7:
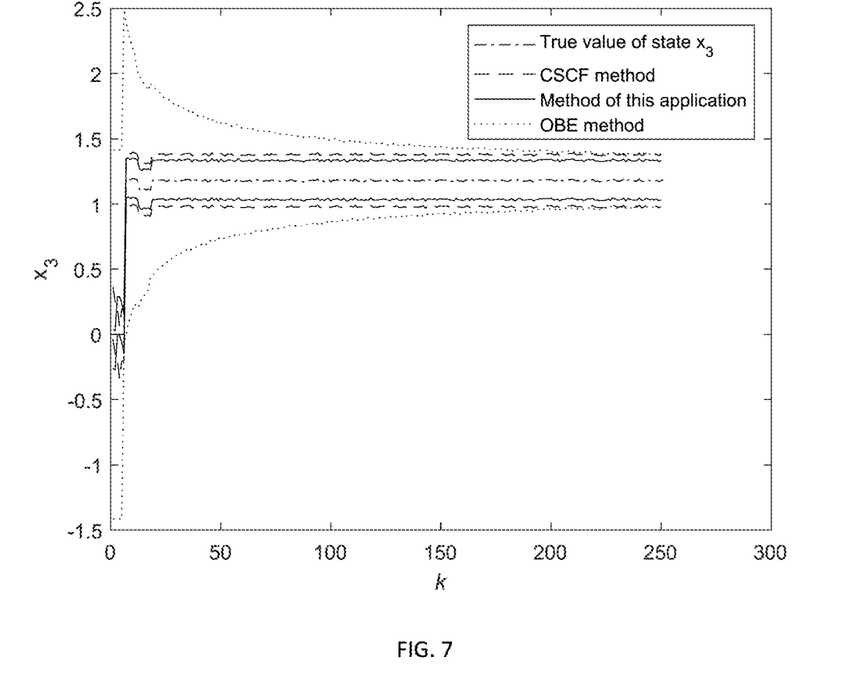
FIG. 7 is a state estimation relationship diagram of a state quantity $x_3$ of a time-delay DC/DC converter circuit system using the method of this application and other two methods disclosed in an embodiment of the disclosure.

In order to verify the accuracy and rapidity of the charging and discharging current and voltage estimation method in the battery formation process provided by this application, the method of this application and the existing OBE method are compared for explanation. Moreover, in order to verify the advantages of the method of this application using two times of update when obtaining the update step, the method of obtaining the prediction step by using only one time of update (hereinafter referred to as the CSCF method) is also compared in this embodiment. FIG. 5, FIG. 6 and FIG. 7 respectively show the variations of upper and lower bounds for state quantity estimation in state estimation of a DC/DC converter system with time delays in a formation process by the method of this application and the existing OBE method and CSCF method, with the estimated step size of 250.

It can be seen from FIG. 5 that when k∈ {0,15}, the upper and lower bounds of the state estimation method provided in this application are basically contracted and are on both sides of the state true value; and when k∈ {0,200}, compared with the upper and lower bounds of the OBE method and the CSCF method, the upper and lower bounds of the state estimation method provided in this application are more tightly contracted and are on both sides of the state true value. Therefore, it can be seen that the method provided in this application has higher convergence accuracy, and compared with the OBE method, this application also has faster convergence speed and better real-time performance.

It can be seen from FIG. 6 that when k∈ {0,15}, the upper and lower bounds of the state estimation method provided in this application are basically contracted and are on both sides of the state true value; and when k∈ {0,200}, compared with the upper and lower bounds of the OBE method and the CSCF method, the upper and lower bounds of the state estimation method provided in this application are more tightly contracted and are on both sides of the state true value.

It can be seen from FIG. 7 that when k∈ {0,15}, the upper and lower bounds of the state estimation method provided in this application are basically contracted and are on both sides of the state true value; and when k∈ {0,200}, compared with the upper and lower bounds of the OBE method and the CSCF method, the upper and lower bounds of the state estimation method provided in this application are more tightly contracted and are on both sides of the state true value. This indicates that the method for charging and discharging current and voltage estimation of the battery formation process provided by the disclosure has the characteristics of high state estimation efficiency, accurate estimation, etc.

Some steps in the embodiments of the disclosure may be implemented by software, and corresponding software programs may be stored in a readable storage medium, such as an optical disk or a hard disk.

The above descriptions are merely preferred embodiments of the disclosure and are not intended to limit the disclosure. Any modification, equivalent replacement and improvement made within the spirit and principle of the disclosure are intended to be included within the protection scope of the disclosure.

What is claimed is:

1. A method comprising:
    step 1: obtaining a model of a time-delay DC/DC converter circuit system;
    step 2: establishing a state space model of discretization of the time-delay DC/DC converter circuit system according to the model of the time-delay DC/DC converter circuit system obtained in step 1;
    step 3: obtaining an initial state space parameter matrix, an initial state quantity, an estimated step size and a time-delay step size h of the time-delay DC/DC converter circuit system;
    step 4: obtaining a convex space representation of a feasible set of predicted states at time k+1 according to the state space model established in step 2 by virtue of the initial state space parameter matrix, the initial state quantity and the time-delay step size h obtained in step 3;
    step 5: based on the convex space representation of the feasible set of the predicted states at the time k+1 obtained in step 4, obtaining a convex space representation of second update of the state at the time k+1;
    step 6: sorting the convex space representation of second update of the state at the time k+1 into linear inequalities according to convex space constraints; and
    step 7: solving the linear inequalities obtained in step 6 by linear programming to obtain upper and lower bounds containing a real state of the time-delay DC/DC converter circuit system at the time k+1.

2. The method according to claim 1, wherein step 5 comprises:
    step 5.1: obtaining a first-round measurement update representation $S_{k+1}$ of the state at the time k+1 according to original output data of a battery system and a system observation matrix; and
    step 5.2: taking an intersection of the first-round measurement update representation $S_{k+1}$ of the state at the time k+1 and the convex space representation of the feasible set of the predicted states at the time k+1 obtained in step 4 to obtain a second-round measurement update representation X(k+1) of the state at the time k+1.

3. The method according to claim 2, wherein the obtaining the first-round measurement update representation $S_{k+1}$ of the state at the time k+1 according to original output data of the battery system and the system observation matrix in step 5.1 comprises:

obtaining the first-round measurement update representation $S_{k+1}$ of the state at the time k+1 according to the following Expression (18):

$$S_{k+1}=\{\tilde{x}(k+1):y(k+1)=C\tilde{x}(k+1)+v(k+1),|v(k+1)|_\infty \leq \bar{v}\} \quad (18),$$

wherein $|v(k+1)|_\infty \leq \bar{v}$ represents an observation noise and interference, indicating that the noise interference meets bounded constraints; and the first-round measurement update representation $S_{k+1}$ of the state at the time k+1 is spatially represented as a strip space.

4. The method according to claim 3, wherein the taking an intersection of the first-round measurement update representation $S_{k+1}$ of the state at the time k+1 and the convex space representation of the feasible set of the predicted states at the time k+1 obtained in step 4 to obtain the second-round measurement update representation X(k+1) of the state at the time k+1 in 5.2 comprises:

obtaining the second-round measurement update representation X(k+1) of the state at the time k+1 according to the following Expression (19):

$$\begin{aligned} X(k+1) &= S_{k+1} \cap \bar{X}(k+1) \\ &= S_{k+1} \cap \text{Set}(\overline{M}_{k+1}, \overline{\alpha}_{k+1}) \\ &= \text{Set}(M_{k+1}, \alpha_{k+1}) \\ &= M_{k+1}x(k+1) \leq \alpha_{k+1}, \end{aligned} \quad (19)$$

wherein $\bar{X}(k+1)$ represents a prediction set at the time k+1, $S_{k+1}$ represents a strip space at the time k+1, Set($M_{k+1}, \alpha_{k+1}$) represents a convex space representation of a real state set, and $M_{k+1}$ and $\alpha_{k+1}$ represent convex space constraints met by the real state at the time k+1.

5. The method according to claim 4, wherein step 6 comprises:

the convex space constraints being as follows:

$$x(k) \in X(k) \subseteq \text{Set}(M_k, \alpha_k) = \{x(k): M_k x(k) \leq \alpha_k\} \quad (21),$$

wherein X(k) represents a feasible set of states containing a real state x(k) of the system at the time k, and Set($M_k, \alpha_k$) represents a convex space composed of feasible set elements x(k);

deriving convex space representations of first-round update according to Expression (18):

$$|y(k+1)-Cx(k+1)| \leq \bar{v}(k+1) \quad (22),$$

$$Cx(k+1) \leq \bar{v}(k+1)+y(k+1) \quad (23),$$

$$-Cx(k+1) \leq \bar{v}(k+1)-y(k+1) \quad (24);$$

sorting the convex space representations into a matrix representation:

$$\tilde{M}_{k+1}x(k+1) \leq \tilde{\alpha}_{k+1} \quad (25);$$

finally, combining the convex space in the prediction step and the update step, and performing sorting and second update to obtain:

$$\overline{M}_{k+1}x(k+1) \leq \overline{\alpha}_{k+1}, \quad (26)$$

$$\tilde{M}_{k+1}x(k+1) \leq \tilde{\alpha}_{k+1}, \quad (27)$$

wherein $$\overline{M}_{k+1} = \overline{M}_{k+1}E^{-1}, \tilde{M}_{k+1} = [C \quad -C]^T$$

$\overline{\alpha}_{k+1} =$ $$\overline{\alpha}_{k-h} + \sum_{i=1}^{h-1} A_i^{-1}\overline{\alpha}_{k-h-i} + A_h^{-1}\overline{\alpha}_{k-2h} + \overline{M}_{k+1}E^{-1}\left[\sum_{j=0}^{h} G_j u(k-j) + \sum_{l=0}^{h} H_l \varpi(k-l)\right]$$

$$\tilde{\alpha}_{k+1} = [v(k+1)+y(k+1) \quad v(k+1)-y(k+1)]^T;$$

and sorting Expressions (26) and (27) to obtain:

$$M_{k+1}x(k+1) \leq \alpha_{k+1}, \text{ wherein} \quad (28)$$

$$M_{k+1} = \begin{bmatrix} \overline{M}_{k+1} \\ \tilde{M}_{k+1} \end{bmatrix}, \alpha_{k+1} = \begin{bmatrix} \overline{\alpha}_{k+1} \\ \tilde{\alpha}_{k+1} \end{bmatrix}. \quad (29)$$

6. The method according to claim 5, wherein step 7 comprises:

obtaining constraints of x(k+1) according to Expression (28);

setting an objective function as:

$$f_1 = [1\ 0\ 0\ 0\ 0\ 0\ 0\ 0] \quad (30)$$

$$f_2 = [0\ 1\ 0\ 0\ 0\ 0\ 0\ 0]$$

$$f_3 = [0\ 0\ 1\ 0\ 0\ 0\ 0\ 0];$$

solving the linear inequalities shown in Expression (28) by a linear programming function in an optimization toolbox of MATLAB software, and continuously iterating the linear inequalities shown in Expression (28) to obtain a convex space that wraps a true value of a system state at each moment at the time k+1 and upper and lower bounds thereof; and performing integration to obtain a state estimation value of the state space model at the time k+1, that is, a state estimation value of the time-delay DC/DC converter circuit system at the time k+1:

$$x(k+1)_f = \frac{x(k+1)_{max} + x(k+1)_{min}}{2}, \quad (31)$$

wherein $x(k+1)_{max}$ represents an upper bound of the state estimation value, and $x(k+1)_{min}$ represents a lower bound of the state estimation value.

7. The method according to claim 6, wherein a state space matrix A of the time-delay DC/DC converter circuit system is:

$$A = \begin{bmatrix} -\dfrac{V_m K P_2}{V_m L} & 0 & -\dfrac{1}{L} - \dfrac{V_m K P_2 K P_1}{V_m L} \\ 0 & -\dfrac{V_m K P_3}{V_m L} & -\dfrac{1}{L} \\ \dfrac{1}{C_1+C_2} & \dfrac{1}{C_1+C_2} & -\dfrac{1}{R(C_1+C_2)} \end{bmatrix};$$

and a state space matrix $A_h$ of the time-delay state quantity is:

$$A_h = \begin{bmatrix} 0 & -\dfrac{V_{in}KI_1KP_2}{V_mL} & 0 \\ 0 & 0 & -\dfrac{V_{in}KP_2KP_1}{V_mL} \\ -KP_1 & 0 & 0 \end{bmatrix},$$

wherein $V_{in}$ represents an input voltage, $V_m$ represents an output voltage, $KP_1$ and $KP_2$ represent parameters of PI controllers used by switch transistors $Q_1$ and $Q_2$, and L, $C_1$ and $C_2$ respectively represent an inductor and two capacitor parameters in a circuit.

8. The method according to claim 7, wherein the input matrix is $$B = \begin{bmatrix} 0.2 \\ 0.3 \\ 0.8 \end{bmatrix}.$$

9. The method according to claim 8, wherein the perturbation action matrix is $$D = \begin{bmatrix} 0.1 \\ 0.1 \\ 0.1 \end{bmatrix}.$$

10. The method according to claim 9, wherein the output matrix is $$C = \begin{bmatrix} 1 & 0 & 0 \\ 0 & 1 & 0 \\ 0 & 0 & 1 \end{bmatrix}.$$

11. The method according to claim 10, wherein the initial state quantity of the time-delay DC/DC converter circuit system is set as: $x_0 = [0\ 0\ 0]^T$.

12. The method according to claim 1, wherein step 4 comprises:
obtaining the convex space representation of the feasible set of the predicted states at the time k+1 according to the state space model established in step 2 by virtue of the initial state space parameter matrix and the initial state quantity obtained in step 3:

$$\overline{X}(k+1) = \{\overline{x}: \overline{x} = A\overline{x}(k) + A_h\overline{x}(k-h) + Bu(k) + Dw(k), \overline{x}(k) \in \overline{X}(k), |w|_\infty \le \overline{w}\} \quad (7),$$

wherein $\overline{X}(k)$ represents a state prediction feasible set at a time k, k≥h, $|w|_\infty \le \overline{w}$;

deriving system state prediction expressions at times k+1, k to k−h by virtue of the formula at a time k≥h in Expression (1), wherein Expression (9) and Expression (10) respectively represent expressions of $\overline{x}(k)$ and $\overline{x}(k-h)$:

$$\overline{x}(k+1) = A\overline{x}(k) + A_h\overline{x}(k-h) + Bu(k) + Dw(k) \quad (8),$$

$$\overline{x}(k) = A\overline{x}(k-1) + A_h\overline{x}(k-h-1) + Bu(k-1) + Dw(k-1) \quad (9),$$

$$\overline{x}(k-h) = A\overline{x}(k-h-1) + A_h\overline{x}(k-h-1) + Bu(k-h-1) + Dw(k-h-1) \quad (10);$$

substituting Expression (9) and Expression (10) into Expression (8) to obtain:

$$\begin{aligned}\overline{x}(k+1) &= A[A\overline{x}(k-1) + A_h\overline{x}(k-h-1) + Bu(k-1) - Dw(k-1)] + \\ & \quad A_h\overline{x}(k-h) + Bu(k) + Dw(k) \\ &= A^2\overline{x}(k-1) + AA_h\overline{x}(k-h-1) + ABu(k-1) + ADw(k-1) + \\ & \quad A_h\overline{x}(k-h) + Bu(k) + Dw(k) \\ &= A^2[A\overline{x}(k-2) + A_h\overline{x}(k-h-2) + Bu(k-2) + Dw(k-2)] + \\ & \quad AA_h\overline{x}(k-h-1) + ABu(k-1) + ADw(k-1) + \\ & \quad A_h\overline{x}(k-h) + Bu(k) + Dw(k) \\ &= (A_h + A^{h+1})\overline{x}(k-h) + \sum_{i=1}^{h} A^iA_h\overline{x}(k-h-i) + \\ & \quad \sum_{i=0}^{h} A^i(Bu(k-i) + Dq(k-i)); \end{aligned} \quad (11)$$

defining the following expressions:

$$E = A_h + A^{h+1} \quad (12),$$

$$F_i = A^iA_h, 1 \le i \le h \quad (13),$$

$$G_j = A^jB, 0 \le j \le h \quad (14),$$

$$H_l = A^lD, 0 \le l \le h \quad (15);$$

substituting Expressions (12) to (15) into Expression (11) to obtain:

$$\overline{x}(k+1) = E\overline{x}(k-h) + \sum_{i=1}^{h} F_i\overline{x}(k-h-i) + \sum_{j=0}^{h} G_ju(k-j) + \sum_{l=0}^{h} H_lw(k-i); \quad (16)$$

and expressing a feasible set of predicted states of the system as the following convex space:

$$\overline{x}(k+1) \in \overline{X}(k+1) \subseteq \text{Set}(\overline{M}_{k-1}, \overline{\alpha}_{k+1}) = \{\overline{M}_{k+1}\overline{x}(k+1) \le \overline{\alpha}_{k+1}\}, \quad (17)$$

wherein $\overline{M}_{k-1} = \overline{M}_{k-h}E^{-1}$, $$\overline{\alpha}_{k+1} = \overline{\alpha}_{k-h} + \sum_{i=1}^{h-1} A_i^{-1}\overline{\alpha}_{k-h-i} + A_h^{-1}\overline{\alpha}_{k-2h} + \overline{M}_{k+1}E^{-1}\left[\sum_{j=0}^{h} G_ju(k-j) + \sum_{l=0}^{h} H_l\overline{w}(k-l)\right],$$

$E = A_h + A^{h+1}, F_i = A^iA_h, G_j = A^jB, H_l = A^lD.$

* * * * *